US010201059B1

(12) United States Patent
Zenteno et al.

(10) Patent No.: US 10,201,059 B1
(45) Date of Patent: Feb. 5, 2019

(54) METHOD FOR ANALYZING OPERATING PARAMETERS FOR LIGHTING TECHNOLOGIES

(71) Applicant: Kleverness Incorporated, Walnut, CA (US)

(72) Inventors: Leobardo Stephen Lincoln Strange Zenteno, Gustavo A. Madero (MX); Dan Nurko Elliot, Naucalpan de Juarez (MX)

(73) Assignee: KLEVERNESS INCORPORATED, Walnut, CA (US)

( * ) Notice: Subject to any disclaimer, the term of this patent is extended or adjusted under 35 U.S.C. 154(b) by 0 days.

(21) Appl. No.: 16/002,177

(22) Filed: Jun. 7, 2018

Related U.S. Application Data

(63) Continuation-in-part of application No. 15/665,894, filed on Aug. 1, 2017, now Pat. No. 10,021,765.

(51) Int. Cl.
*H05B 37/02* (2006.01)
*G01R 31/44* (2006.01)

(52) U.S. Cl.
CPC ......... *H05B 37/0227* (2013.01); *G01R 31/44* (2013.01); *H05B 37/0245* (2013.01)

(58) Field of Classification Search
CPC ............... H05B 37/02; H05B 37/0227; H05B 37/0245; H05B 37/0272; H04L 67/12; G05B 13/0265; G08C 17/02; G08C 2201/20; G08C 2201/30; G08C 2201/31; G01R 31/44
USPC ................. 315/151, 291, 297, 307, 308, 312
See application file for complete search history.

(56) References Cited

U.S. PATENT DOCUMENTS

| | | | |
|---|---|---|---|
| 5,038,081 A | 8/1991 | Maiale, Jr. et al. |
| 7,446,671 B2 | 11/2008 | Giannopoulos et al. |
| 7,687,940 B2 | 3/2010 | Mosebrook et al. |
| 8,492,984 B2 | 7/2013 | Deurenberg et al. |
| 8,664,881 B2 | 3/2014 | Newman, Jr. et al. |
| 8,892,913 B2 | 11/2014 | Newman, Jr. et al. |
| 8,922,133 B2 | 12/2014 | Hausman, Jr. et al. |
| 9,084,324 B2 | 7/2015 | Salvestrini |
| 9,250,669 B2 | 2/2016 | Blakeley et al. |
| 9,343,997 B2 | 5/2016 | Newman, Jr. et al. |
| 9,343,998 B2 | 5/2016 | Newman, Jr. et al. |
| 9,354,643 B2 | 5/2016 | Harel |

(Continued)

FOREIGN PATENT DOCUMENTS

| | | |
|---|---|---|
| AU | 7472981 A | 3/1982 |
| CN | 201188670 Y | 1/2009 |

(Continued)

*Primary Examiner* — Jimmy Vu
(74) *Attorney, Agent, or Firm* — Shumaker, Loop & Kendrick, LLP

(57) ABSTRACT

The present invention describes a method for measuring and evaluating operating parameters in lighting technologies for smart switches. Said method is characterized in that from the acquisition and filtering of data the measurement of current consumption, determination of technology type, detection of the irregular behavior in the operation of the at least one lighting device and determination and selection of the dimming mode are obtained through different functions which comprise a number of steps which, when performed, obtain the different results corresponding to each function and which are used and sent to a central module.

9 Claims, 10 Drawing Sheets

(56) References Cited

U.S. PATENT DOCUMENTS

| | | | |
|---|---|---|---|
| 9,401,588 B2 | 7/2016 | Zulim et al. | |
| 9,418,809 B2 | 8/2016 | Hausman, Jr. et al. | |
| 9,572,215 B2 | 2/2017 | Datta | |
| 9,595,880 B2 | 3/2017 | Knode et al. | |
| 9,853,561 B2 | 12/2017 | Newman, Jr. et al. | |
| 9,941,811 B2 | 4/2018 | Newman, Jr. et al. | |
| 9,986,624 B2 | 5/2018 | Vangeel et al. | |
| 10,021,765 B1 | 7/2018 | Elliot et al. | |
| 2006/0049935 A1* | 3/2006 | Giannopoulos | H05B 37/02 340/533 |
| 2010/0101924 A1 | 4/2010 | Wu et al. | |
| 2013/0300545 A1 | 11/2013 | Rao et al. | |
| 2016/0095189 A1* | 3/2016 | Vangeel | G06F 8/654 315/152 |
| 2016/0124453 A1 | 5/2016 | Blakeley et al. | |

FOREIGN PATENT DOCUMENTS

| | | |
|---|---|---|
| CN | 201589976 U | 9/2010 |
| CN | 102063102 A | 5/2011 |
| CN | 202551079 U | 11/2012 |
| CN | 102882752 A | 1/2013 |
| CN | 203250198 A | 10/2013 |
| CN | 103475554 A | 12/2013 |
| CN | 203339430 U | 12/2013 |
| CN | 103596294 A | 2/2014 |
| CN | 104330974 A | 2/2015 |
| CN | 204156886 U | 2/2015 |
| CN | 204190090 U | 3/2015 |
| CN | 204217165 U | 3/2015 |
| CN | 204241946 U | 4/2015 |
| CN | 204719434 U | 10/2015 |
| CN | 204719435 U | 10/2015 |
| CN | 204719436 U | 10/2015 |
| CN | 204719514 U | 10/2015 |
| CN | 204719515 U | 10/2015 |
| CN | 204832937 U | 12/2015 |
| CN | 105338699 A | 2/2016 |
| CN | 105632162 A | 6/2016 |
| CN | 205388682 U | 7/2016 |
| CN | 205726601 U | 11/2016 |
| CN | 106325240 A | 1/2017 |
| CN | 205921804 U | 2/2017 |
| IN | 20130263414 A | 6/2016 |
| JP | 2012174488 A | 9/2012 |
| KR | 2013110763 A1 | 10/2013 |
| WO | 2009099082 A1 | 8/2009 |
| WO | 2016014957 A1 | 1/2016 |

\* cited by examiner

METHOD FOR ANALYZING OPERATING PARAMETERS FOR LIGHTING TECHNOLOGIES

CROSS REFERENCE TO RELATED APPLICATIONS

This application is a Continuation-In-Part claiming priority from U.S. patent application Ser. No. 15/665,894, filed on Aug. 1, 2017, entitled INTELLIGENT SWITCH DEVICE AND CENTRAL CONTROL SYSTEM THEREOF, the entire disclosures of which are hereby incorporated by reference.

TECHNICAL FIELD OF THE INVENTION

The present invention relates to the technical field of smart switches, specifically functions that said smart switches can perform for analyzing operating parameters, such as the measurement and evaluation of parameters of lighting devices preferably for domestic use.

BACKGROUND OF THE INVENTION

In recent years, domotics, home automation and the implementation of intelligent homes have demanded the improvement of the intelligent devices implemented in this technological field, such is the case of smart switches which have more and more functions implemented, which offer the user greater ease of information about their lighting system, as well as better interaction.

At present, there are some intelligent switches with two or three ways that can measure parameters of the lighting devices to which they are connected. Said smart switches, mainly, are characterized because they are only able to measure one or two parameters of the lighting devices they control. Within these parameters it has been found that the most predominant is the measurement of electrical/power consumption, which few smart switches can perform, wherein the method used to determine the electrical consumption is based on sampling the current consumption of the lighting device during a time interval of operation, said sampling being processed by a microcontroller to determine the electrical/power consumption. There are also two- or three-way smart switches that can dim different lighting technologies (LED, CFL and incandescent bulb), wherein the lighting intensity dimming is carried out through methods known as leading or trailing edge.

The state of the art discloses smart switches that can measure the electrical consumption of the lighting devices, such is the case of U.S. Pat. No. 9,250,669 B2, which discloses an energy measurement chip included in a device for controlling lighting devices. A voltage signal in the lighting device is provided for the energy measurement chip, said energy measurement chip calculates the energy consumed by the lighting device and communicates said calculation to a controller external to the energy measurement chip. However, said US patent does not disclose a data filtering to eliminate the noise present in the voltage signal, wherein said filtering is comprised by an amplitude filtering, a frequency filtering and a magnitude filtering. Data filtering allows ignoring variations or small voltage peaks that affect the treatment and evaluation of the voltage signal analyzed. Another great difference found is that the US patent does not disclose or suggest a method of detecting type of lighting device technology, that is, said US patent can not determine if the lighting device is an incandescent halogen device (incandescent bulb) or a compact fluorescent device (CFL) or a light-emitting diode (LED) device. Also, said US patent fails to disclose or suggest a method of detecting irregular behavior in the operation of a lighting device, i.e., said US patent can not determine if an intelligent device is consuming more current than it should and probably the lighting device is in a state of deterioration. As a last difference, said US patent does not mention anything regarding a method of detection and selection of a dimming mode, that is, said US patent can not detect the most appropriate dimming mode for the lighting device, trailing or leading mode, and once the most appropriate dimming mode has been detected, selecting said mode.

On the other hand, US patent application US 2014312869 A1 discloses a universal lighting device control module that allows to provide a reverse phase cut dimming mode and a forward phase cut dimming mode. Said US patent application uses zero crossing information of the current signal to synchronize the inner timer of the microcontroller of the universal lighting device control module with the input power at 60/50 Hz. The above allows the microcontroller to provide a PWM control signal synchronized with the input power and thus have a smooth and flicker-free performance of the lighting device. However, said US application does not mention anything concerning the detection of the most appropriate dimming mode for the intelligent device by means of the analysis of the input voltage signal (subsequently transformed to a current signal) simultaneously in the two dimming modes, trailing and leading modes, wherein said analysis is performed in a single cycle of the sine wave analyzed. In addition, said application does not mention anything referring to selecting the most appropriate dimming mode by means of the maximum current detected, so that, if said maximum current detected is before 25% of the cycle of the sine wave analyzed, leading mode is selected, otherwise, trailing mode is selected. Also, said US application fails to disclose or suggest a method of detecting irregular behavior in the operation of a lighting device, i.e., said US application can not determine whether an intelligent device is consuming more current than it should and probably the intelligent device is in a state of deterioration. Another great difference found is that said US application does not disclose or suggest a method of detecting the type of lighting device technology, i.e., said US application can not determine whether the lighting device is an incandescent halogen device (incandescent bulb) or a compact fluorescent device (CFL) or a light-emitting diode (LED) device. As a last difference, said US patent fails to provide a method for determining the energy consumption of an intelligent device, that is, the US application does not determine how much current, and therefore, how much power the lighting device is using.

Now, U.S. Pat. No. 9,595,880 B2 discloses a control module comprising one or more energy measuring circuits, a current measurement circuit and a voltage measurement circuit. Said current measuring circuit measures the magnitude of the load current conducted in the lighting device. Likewise, the voltage measurement circuit measures the magnitude of the voltage line of the AC power source. In turn, said US patent generates a phase control signal using standard dimming techniques to control the dimming of the lighting device. However, said US patent does not disclose data filtering to eliminate the noise present in the voltage signal and the current signal, wherein said filtering is comprised by an amplitude filtering, a frequency filtering and a magnitude filtering. Data filtering allows to ignore variations or small voltage peaks that affect the treatment and evaluation of the voltage signal and current signal analyzed. Another great difference found is that said US patent fails to disclose or suggest a method of detecting the type of lighting device technology, that is, said US patent can not determine if the lighting device is an incandescent halogen device (incandescent bulb) or a compact fluorescent device (CFL) or a light-emitting diode (LED) device. Also, said US patent fails to disclose or suggest a method of detecting irregular behavior in the operation of a lighting device, i.e., said US patent can not determine if an intelligent device is consuming more current than it should and whether said intelligent device is in a state of deterioration. Although said US patent uses standard dimming techniques to control dimming of the lighting device, it fails to disclose or suggest that the detection of the most appropriate dimming mode for the intelligent device is through the analysis of the input voltage signal (subsequently transformed to current signal) simultaneously in the two dimming modes, trailing and leading mode, wherein said analysis is performed in a single cycle of the sine wave analyzed. In addition, said application does not mention anything referring to selecting the most appropriate dimming mode by means of the maximum current detected, so that, if said maximum current detected is before 25% of the cycle of the sine wave analyzed, the leading mode is selected, otherwise, the trailing mode is selected.

Another relevant document is Japanese Patent Application JP 2001135491 A, which discloses a device comprising a first and second switch elements connected in series, said first and second lighting circuits include a resonance circuit connected in parallel with the second switch element and a fluorescent lamp for exclusive use of high frequency lighting. Said device detects, precisely, anomalies in the behavior of a fluorescent lamp, wherein said anomalies are representative of the last life cycles of said fluorescent lamp, in turn, discloses a device for fluorescent lamps that maintains a desirable lighting condition despite the anomalies in the behavior of the fluorescent lamp. Although said Japanese Patent Application discloses a method of detecting irregular behavior in the operation of a lighting device, said Japanese Patent Application is only focused on high frequency lighting devices, specifically fluorescent lamps. In contrast, the present invention is capable of detecting anomalies in any lighting device, such as an incandescent halogen device (incandescent bulb), a compact fluorescent device (CFL) and a light emitting diode (LED) device. Likewise, said Japanese Patent Application fails to disclose a method of detecting the technology type of the lighting device, nor a method of determining the energy consumption of a lighting device, nor a method of detecting and selecting a dimming mode.

More generally, U.S. Pat. No. 8,492,984 B2, U.S. Pat. No. 9,354,643 B2, U.S. Pat. No. 9,401,588 B2, U.S. Pat. No. 9,572,215 B2, U.S. Pat. No. 9,084,324 B2, U.S. Pat. No. 5,038,081 A and US Patent Application US 20100101924 A1 disclose techniques for selecting dimming mode and control of a lighting device. For example, U.S. Pat. No. 8,492,984 B2 refers to a method of self-detection between a dimming mode and a phase cut dimming mode; U.S. Pat. No. 9,354,643 B2 is directed to an intelligent dimming solution for lighting devices such as light emitting diodes (LED) and other non-linear lighting devices; U.S. Pat. No. 9,401,588 B2 is directed to a universal lighting device control module that controls the dimming of a lighting device by means of reverse phase cut dimming mode, forward phase cut dimming mode, and a hybrid dimming mode; U.S. Pat. No. 9,572,215 B2 is focused on a method and apparatus for correcting an incorrect dimming operation; U.S. Pat. No. 9,084,324 B2 discloses a lighting device control device, such as a light emitting diode (LED) dimming switch, which is configured to automatically determine whether to provide a reverse phase cut dimming mode or a forward phase cut dimming mode; U.S. Pat. No. 5,038,081 A is directed to controlling an AC load, specifically an incandescent bulb, by means of the reverse phase-controlled dimming mode, by changing the power of the ON/OFF load during each half cycle of the sine wave; and, finally, U.S. Patent Application US 20100101924 A1 is directed to a switch device for controlling the state of a lighting device that includes a control element, which controls at least one sensor and sensitivity range of at least one sensor component, wherein said sensor component detects at least one condition and causes the switching device to control the state of the lighting device. However, said U.S. Patents do not mention anything regarding the detection of the most appropriate dimming mode for the intelligent device by means of the analysis of the input voltage signal (subsequently transformed to a current signal) simultaneously in the two dimming modes, trailing or leading mode, wherein said analysis is performed in a single cycle of the sine wave analyzed. Furthermore, said U.S. Patents and Application do not mention anything regarding selecting the most appropriate dimming mode by means of the maximum current detected, so that, if said maximum current detected is before 25% of the cycle of the sine wave analyzed, leading mode is selected, otherwise, trailing mode is selected. Likewise, said U.S. Patent and Application fail to disclose or suggest a method for detecting irregular behavior in the operation of a lighting device, or a method for detecting the type of lighting device technology, or a method for determining the power consumption of an intelligent device.

In addition, there are other patent applications that speak of techniques for selecting dimming mode and control of a lighting device, such as AU 198174729 A and WO 2016014957 A1. For example, the Australian Patent Application focuses on a method for controlling lighting devices in an electrical installation, which comprises the steps of modifying the waveform that is provided from the electrical installation to deliver detectable control signals of a plurality of distinctly different forms. From the foregoing, the method of said Australian Patent Application is different from the method used in the present invention, wherein the difference is that the present method uses trailing or leading dimming mode, while the Australian Application method does it differently. Now, the International Patent Application discloses a control module that determines whether the lighting devices respond effectively and automatically to a plurality of dimming control techniques. That is, the control module performs a trial and error on the lighting devices to determine the most efficient dimming mode. However, none of these documents mentions anything regarding the detection of the most appropriate dimming mode for the intelligent device by means of the analysis of the input voltage signal (subsequently transformed to the current signal) simultaneously in the two dimming modes, trailing or leading mode, wherein said analysis is performed in a single cycle of the sine wave analyzed. In addition, said application does not mention anything about selecting the most appropriate dimming mode by means of the maximum detected current, so that, if said maximum current detected is found before 25% of the sine wave cycle analyzed, the leading mode is selected, otherwise, trailing mode is selected. Also, said Patent Applications fail to disclose or suggest a method of detecting irregular behavior in the operation of a lighting device, nor a method of detecting the type of lighting device technology, nor a method of determining energy consumption of an intelligent device.

In turn, there are two U.S. Pat. No. 9,250,669 B2 and U.S. Pat. No. 8,476,895 B2, which disclose methods aimed to measuring the energy consumption of lighting devices. However, said U.S. Patents do not disclose data filtering to eliminate the noise present in the voltage signal, wherein said filtering is comprised by an amplitude filtering, a frequency filtering and a magnitude filtering. Data filtering allows ignoring variations or small voltage peaks that affect the treatment and evaluation of the voltage signal analyzed. Another major difference found is that said U.S. Patents do not disclose or suggest a method for detecting the type of lighting device technology, nor a method of detecting irregular behavior in the operation of a lighting device, nor a method for selecting and detecting a dimming mode. In turn, there is a Patent Application Document WO 2009099082 A1 which, likewise, is focused on measuring the energy consumption of lighting devices; however, it fails to disclose the novel differences mentioned above.

Taking into account the differences and defects of the prior art, it is notable that the prior art mentioned in the preceding paragraphs fails to disclose or suggest the novel and inventive technical features of the present invention.

SUMMARY OF THE INVENTION

The present invention discloses a method to be implemented in a plurality of intelligent switch devices connected to a plurality of lighting devices, wherein said method comprises different functions which are: determination of electrical/energy consumption of the lighting devices connected in each way of the high-power module of the intelligent switch device, detecting or determining the type of lighting devices connected in each way of the high-power module, detecting irregular behavior in the operation of lighting devices connected by each way of the high-power module, which is applicable to different types of lighting technologies and in a secondary mode, for a dimmer-type intelligent switch device, a function that allows to automatically select the most appropriate dimming mode for a lighting device depending on the type of technology connected thereto, to achieve proper operation.

For performing the various functions of the method, the intelligent switch device comprises different elements internally, such as a current sensing module for measuring the current consumed by each way of the high power module and obtaining the measurable parameters of the plurality of operating lighting devices, the intelligent switch device also having a microcontroller that conditions the samples taken through the different steps of the functions of the method, in order to analyze and evaluate the n samples taken from the signals passing through the intelligent switch device, and finally the results are sent through a communication module to a database record of the central control system, wherein said results can be used for performing the different functions. For example, this record can be communicated to an external supplier of lighting devices, which can offer new lighting products in order to reduce power consumption or to replace a damaged lighting device, or such data can be used for a statistic record of the energy consumption per minute, hour, day, week, month and year.

It is worth mentioning that said method can perform the functions together or individually. The method can be performed at the beginning of the configuration, when the user requests it in the installation of new lighting devices and/or when the central control system requests said information.

Throughout the description of the present invention indistinct terms and their variants will be used which do not affect the scope of the present invention, said terms are obvious and understandable to a person skilled in the art. When the term lighting device is used, it can be understood as a lighting load or a bulb or any synonym thereof and that can be any type of technology, such as; resistive, halogen, LED, CFL or other types of technologies known for lighting. When the term current consumption is used, reference is also made to electric current consumption. When reference is made to energy consumption, it also refers to power or electrical energy consumption. When the term smart switch is used, it also refers to intelligent switch, smart switch device, intelligent switch device, or any synonym thereof.

BRIEF DESCRIPTION OF THE FIGURES

The aspects that are considered characteristic of the present invention will be particularly set forth in the appended claims. However, the invention itself, both by its organization and by its method of operation, together with other objects and advantages thereof, will be better understood in the following description, when read in relation to the accompanying figures, in which:

DETAILED DESCRIPTION OF THE INVENTION

While the present invention is illustrated with reference to a method for analyzing operating parameters in lighting technologies having a particular configuration and containing particular features, the present invention is not limited to this configuration or to those features, and other configurations and features can be used that will be included within the scope of the present invention by those skilled in the art.

Similarly, while the description of the present invention is detailed and accurate to allow those of ordinary skill in the art to be able to perform the invention, the invention may be presented or embodied in other structures in addition to the illustrative structure shown. The scope of the invention is defined in the claims appended hereto.

In a preferred embodiment, the smart switch device 100 corresponds to an ON/OFF switch 605. In a secondary mode, the smart device 100 can be: dimmer type or a remote switch type, among others 606.

Figure 1:
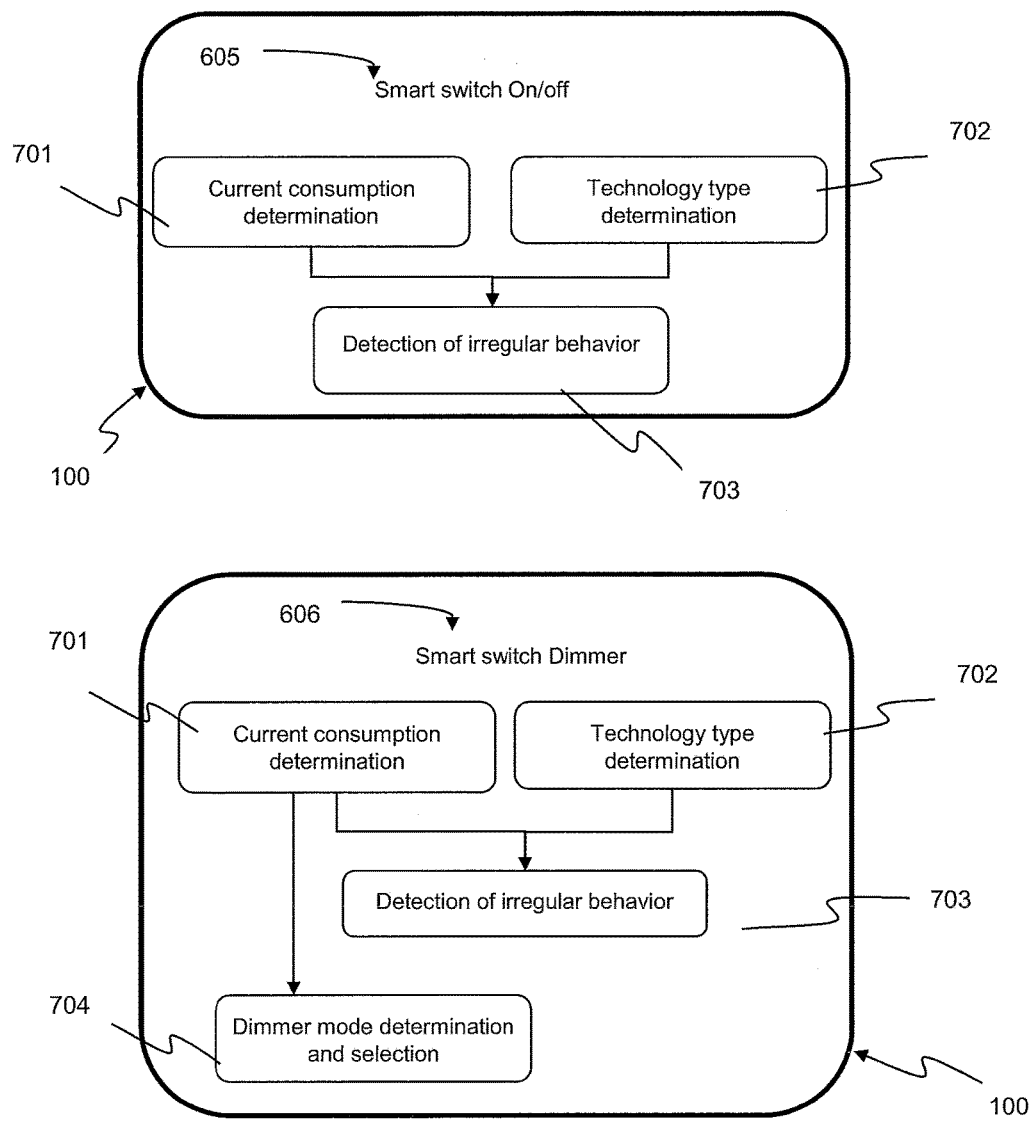
FIG. 1 is a general scheme of the functions performed according to the type of smart switch device.

FIG. 1 depicts a smart switch device 100 which, in a preferred embodiment, is an ON/OFF switch 605 and comprises the functions of current consumption determination 701, technology type determination 702 and detection of irregular behavior in the operation 703 of a lighting device connected thereto. In another preferred embodiment, the smart switch device 100 may be a dimmer type switch 606 comprising the functions of current consumption determination 701, technology type determination 702 and detection of irregular behavior in operation 703 of a lighting device connected thereto; it also includes the dimming mode determination and selection function 704.

Figure 2:
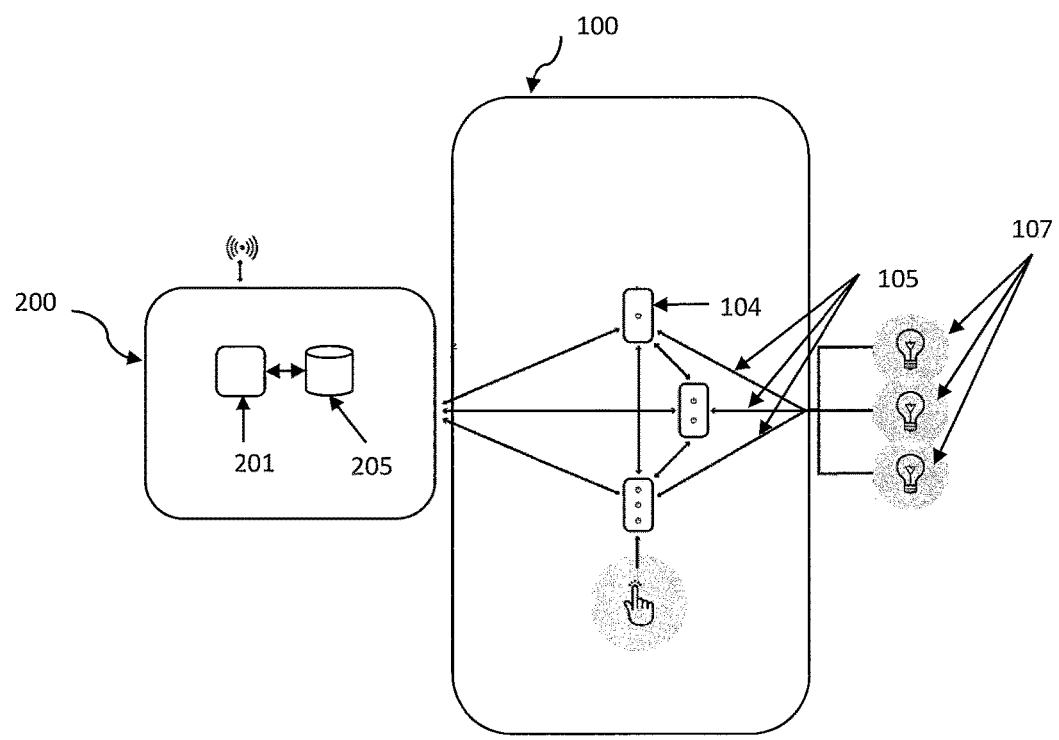
FIG. 2 is a general scheme of a plurality of smart switch devices connected to a plurality of lighting devices and in communication with a central control system.

FIG. 2 represents the interaction of a smart switch device 100 connected to a plurality of lighting devices 107 and in communication with a central control system 200 that allows performing the various functions of the method. It is to be noted that a smart switch device 100, in a preferred embodiment, comprises a plurality of ON/OFF switches 605 connected to a plurality of lighting devices 107. By way of example, in a preferred embodiment, an ON/OFF switch 605 comprises three lines 105 and each line 105 comprises a lighting device 107. In a secondary embodiment a dimming type 606 smart switch device 100 comprises of a line lighting device 105.

Figure 3:
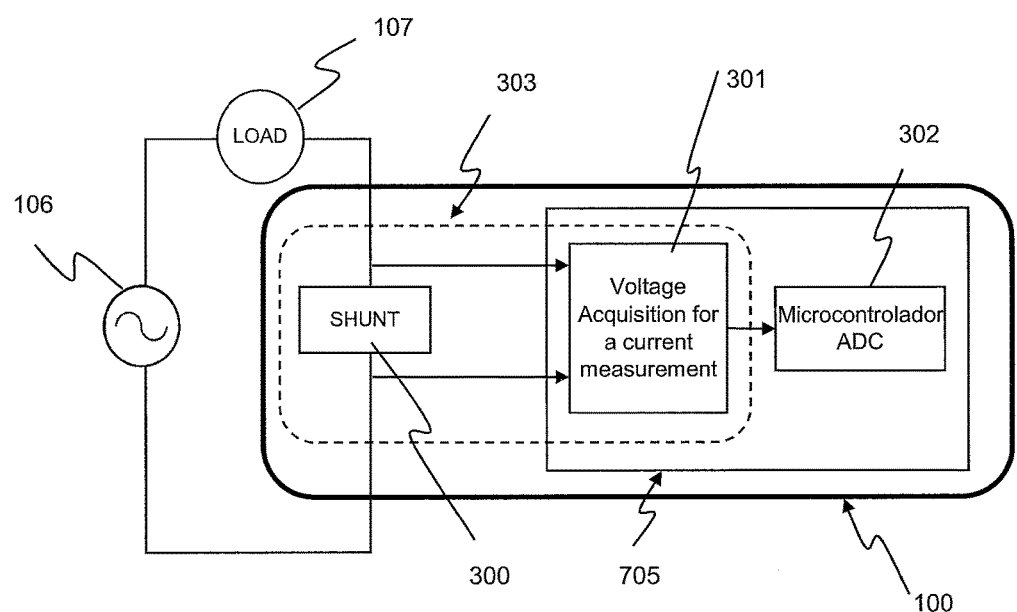
FIG. 3 is a general scheme of a circuit for measuring the current consumption of a lighting device.

Referring to FIG. 3, it shows a general scheme of a closed circuit in which the current flows through the components that comprise it, for example, when the state of a smart switch device 100 changes to an ON state, current begins to flow through the circuit and inside the smart switch device 100 there is a resistor (simulating a voltage divider) in series with the lighting device 107 and the source of Alternating Current, AC 106. This series resistor is called shunt resistor 300 and its resistance value is low because a current will flow therethrough at a range of 0 to amperes. In another embodiment of the invention the voltage acquisition for the current measurement is performed by a hall effect sensor 303 or any element able to measure the current that galvanically isolates the circuit from the AC current 303.

The shunt resistor 300 is located within the smart switch device 100 in the power module called Electrical Power System, EPS, wherein said shunt resistor 300, a hall effect sensor 303 or any element able to measure the current 303 is arranged in a particular configuration so that the smart switch device 100 determines the power consumption, namely, the current passing through the lighting device 107.

The consumed current passing through each line 105 passes through the shunt resistor 300, wherein the shunt resistor 300, by being in series with the lighting load 107, measures the voltage of the shunt resistor 300 for determining the consumption of current of the lighting device 107 given the direct relationship between voltage and current established by the Ohm's Law. Since the shunt resistor 300 has a low resistance value, the measured voltage signal has it so, therefore, a treatment comprising an amplification and offset step is applied to the analog voltage signal. The smart switch device 100 comprises a current sensing module 301, wherein the current sensing module 301 comprises the amplification step for amplifying the measured voltage signal of the shunt resistor 300 using a gain established by the configuration of the amplifiers, thus avoiding saturating the amplification elements, the current sensing module also could be integrated as part of a hall effect sensor 303 or any element able to measure the current 303 and in the output thereof get a voltage signal. In the current sensing module 301, a reference voltage (an offset) is also applied to acquire a voltage signal with positive values, that is, the negative half-wave of the sampled voltage signal becomes positive, thus, the analog voltage signal of the shunt resistor 300 is compatible with the voltage level required by the Digital Analog Converter, ADC 302 of the microcontroller of the smart switch device 100. Once the analog voltage signal is processed, it is sent to the input of an ADC 302 of the smart switch device 100, to convert the analog voltage signal to a digital voltage signal. These voltage signal data converted by the ADC are used for the different functions such as determination of current consumption, determination of the lighting device technology type connected to the power supply, detection of irregular behavior in the operation of the lighting device and determination and selection of a dimming mode.

Figure 4:
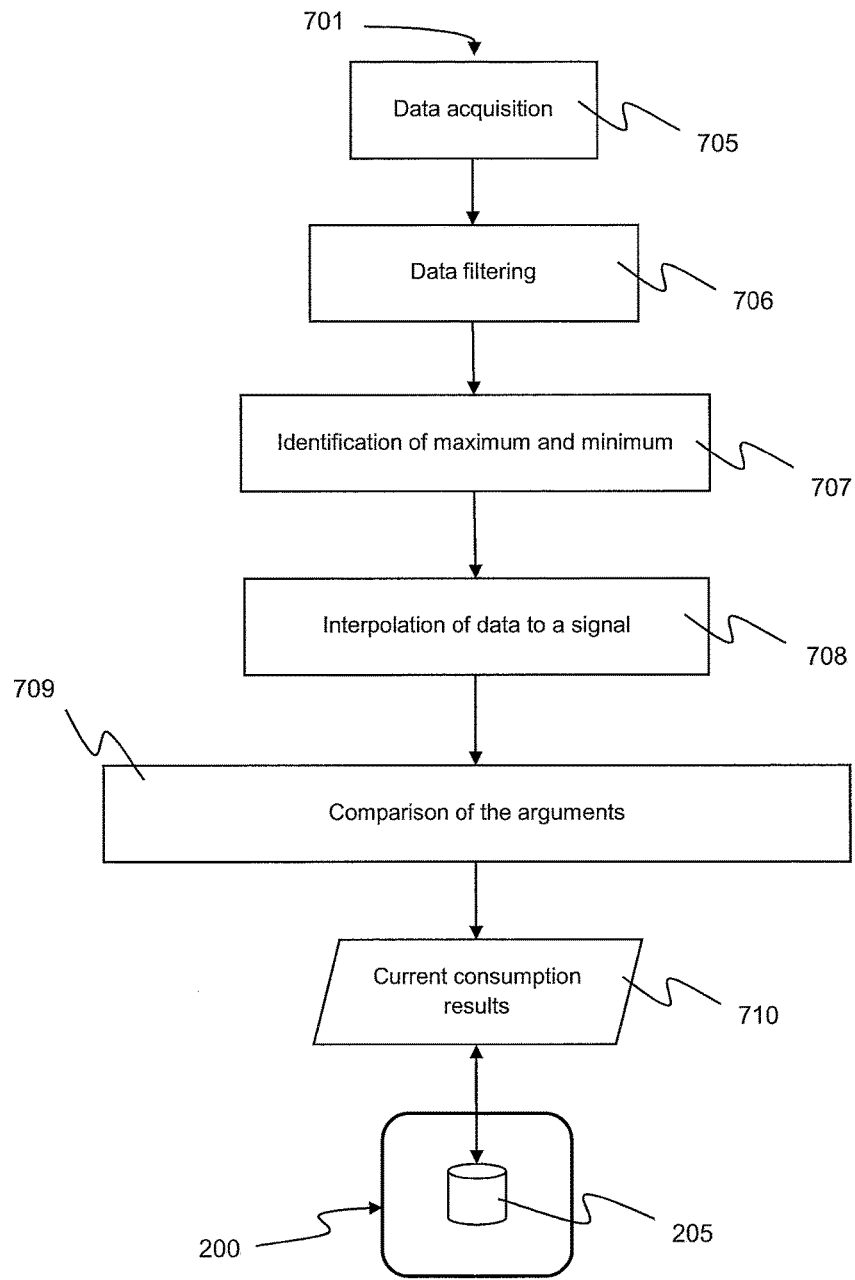
FIG. 4 is a flowchart of the steps performed by the function for determining the current consumption of a lighting device.

FIG. 4 depicts, in a preferred embodiment, a flowchart of a function for determining the current consumption 701 of the lighting device 107 connected to the smart switch device 100, said function 701 being performed by a microcontroller of the smart switch device 100 when the smart switch device 100 is in an ON state and the components are in series, for example, as shown in FIG. 2.

The function 701 is performed each time that the central control system 200 requests it. In a preferred embodiment, said function 701 is initiated in step 705, for example, after the smart switch device 100 is turned ON, the current begins to flow through the lighting device 107 and the components of the smart switch device 100.

In step 705, the instant current samples of the lighting device 107 are acquired and processed first, the instant current consumption sampling being performed by each line of the smart switch device 100. The instant current consumption of the lighting device 107 is determined through the proportional relation of the voltage that is measured in the shunt resistor 300 which is an analog voltage signal, this analog voltage signal is first passed through the current sensing module 301 so that the analog voltage signal is amplified and conditioned so that it can be read by the ADC 302 module. Once the analog voltage signal has been conditioned, said analog voltage signal enters the ADC 302 so that it becomes a digital voltage signal. In this step 705 a number of n samples of values of the voltage signal representing the instant current are taken, for example, in a preferred embodiment, for each wave cycle of the current signal, an approximate of 256 samples is recorded per wave cycle or a total of 800 samples in a given period of time or depending on the number of samples that are required by the function. The voltage signal samples are taken during a certain period of time. In a preferred embodiment, the time period comprises a range of 1 to 83 µs (1 mHz to 12 kHz).

The data of the samples obtained from the voltage signal represent the current consumed by the lighting device 107, and are stored in an array of variables in a stored data matrix, for example, inside a memory of the microcontroller, processor or microprocessor of the smart switch device 100 to facilitate their treatment and processing.

In step 706, a data processing is applied to the voltage signal of the samples obtained in step 705. By way of detail, in a preferred embodiment, an amplitude filtering is applied to eliminate the noise in the signal of voltage due to the noise existing in the AC source 106, known as a Noise Reduction Filter, NRF filter type. Since small variations or small voltage peaks are possible in the voltage curve, they can be eliminated or ignored so that they do not affect the analysis of the signal. Therefore, in a preferred embodiment, an amplitude filter is applied to eliminate said peaks, which generally results in an average of said peaks lying on the voltage curve, in order to correct and smooth the voltage signal.

The filtering of data also involves applying a Magnitude Filtering, FM, filter type, wherein the signals of low amplitude are eliminated. The filtering of data further comprises applying a frequency filter, in a preferred embodiment, an N order Finite Impulse Response, FIR, filter type is applied. For example, in the N order Finite Impulse Response, FIR, 128, signals of high frequency are filtered. Subsequently, the filtered voltage signals samples are converted to a current signal according to the proportional voltage and current ratio, so as to represent the samples in a current consumption signal of the lighting device 107.

In step 707, once the voltage signal converted into the current signal of the lighting device 107 is received, the microcontroller of the smart device 100 performs a methodology for identifying maxima and minima of the lighting device 107 current consumption.

In step 708, a polynomial interpolation method is applied to attenuate the current signal due to the set of discrete data found in the current signal. By way of example, a general Newton polynomial is used, or, in a secondary embodiment, any other known interpolation method is used.

In step 709, some features of the current signal are determined for use in performing the functions; in a preferred embodiment, the standard deviation of the current samples is obtained. On the other hand, in another preferred embodiment, the average of the attenuated current signal is calculated to obtain a Root Mean Square, RMS, of the consumed current of the lighting device 100 in order to correctly estimate the current consumption. For the calculation of the RMS, since the current signal can be expressed as a continuous variable function and a set of n variable values is registered, the Root Mean Square, RMS, or the effective value of the current signal can be obtained; in a preferred embodiment, it is obtained by calculating the root mean square.

Continuing with step 709, a comparison is made of the data obtained from the previous steps. For example, in a preferred embodiment, the current signal is compared to the time, AC voltage, source voltage of the smart switch device, among other possible variants of comparison or of measurable parameters for a thorough analysis of the current consumption. Additionally, it is worth mentioning that each of the signals for each lighting device is isolated from a calculation of power consumption in milliwatts through the variance obtained from the statistical methods mentioned above.

At the end, among all the comparisons, a result 710 of comparison of the current samples with respect to the time of the current consumption for each line or way of the smart switch 100 is obtained.

As an additional process of the final result, in an experimental calibration carried out previously, current consumption models of the existing lighting devices are obtained according to the different types of lighting technologies, which are tested in factory conditions, said consumption models obtained are stored on a database 205 within a memory of the central control system 200. In said process the current consumption results 710 of the lighting device 107 are verified with the current consumption models of the database and, thus, the RMS current is estimated more accurately.

The final result of the current consumption is stored in the database 205 of the central control system 200 by means of a record to be used in subsequent calculations required by the central control system 200.

Figure 5:
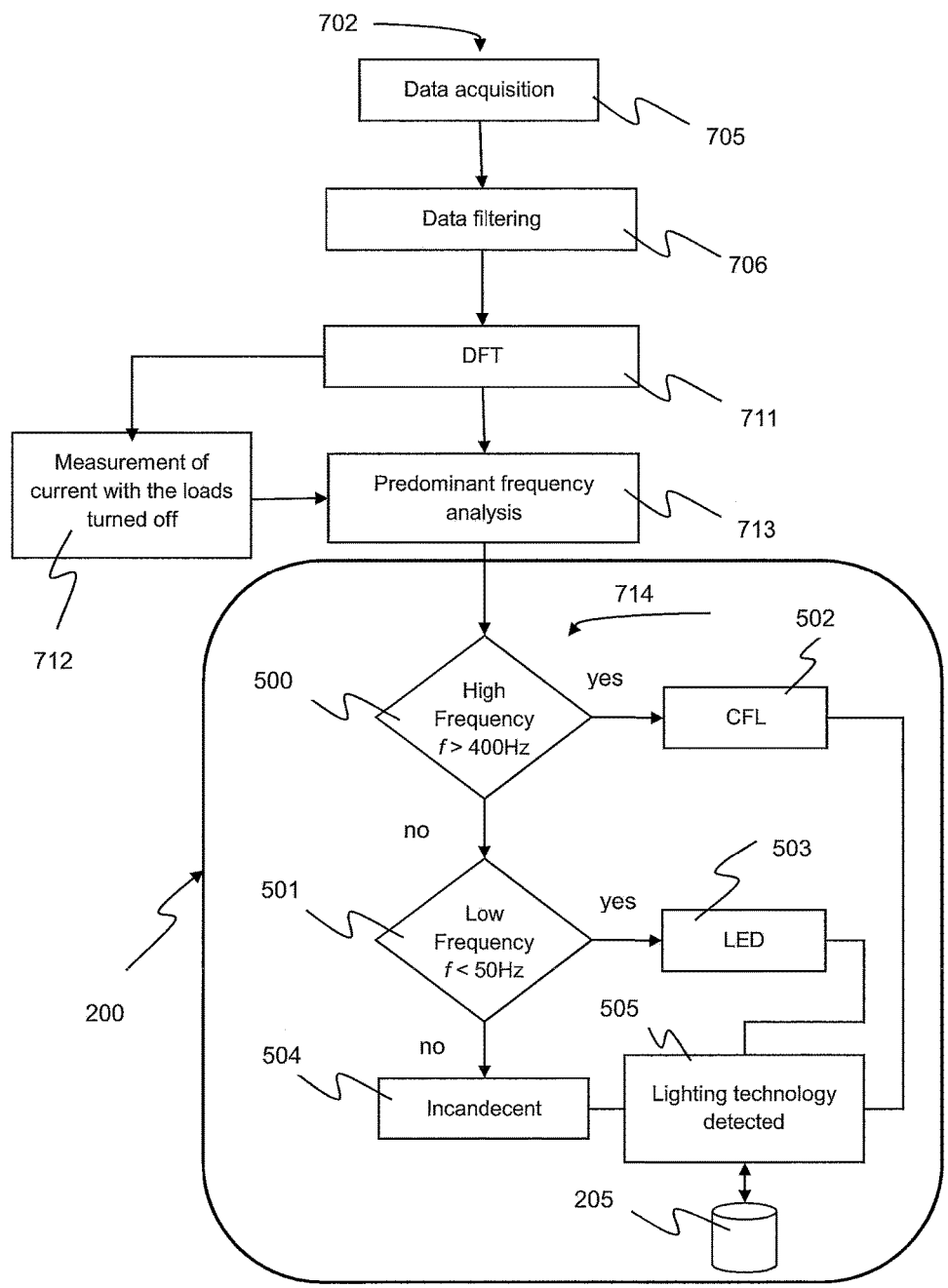
FIG. 5 is a flowchart of the steps performed by the technology type determination function of a lighting device.

Referring to FIG. 5, a flowchart of a function for determining the type of technology of the lighting device 702 connected to the smart switch device 100 is shown in a preferred embodiment, said function being also performed by the microcontroller of the smart switch device 100. The function 702 is performed each time that the central control system 200 requests it. This function 702 performs the same procedure of step 705 described above; however, in this function 702 the number of samples taken that can be n number of samples is changed, or in a preferred embodiment, about 1 million samples can be taken to perform the function 702 for determining the technology type of the lighting device. In a preferred embodiment, by obtaining in this step 705 the digital voltage samples representing the instant current consumed by the lighting device 107, said samples may or may not be stored in the memory of the microcontroller due to the amount of data obtained.

With the voltage samples obtained from step 705 a data filtering similar to the procedure of step 706 is applied. In a preferred embodiment, the filtering of data may be an amplitude filtering to eliminate the noise in the voltage signal due to the noise existing in the AC source 106, the applied filter being determined as a Noise Reduction Filter, NRF, filter type. Furthermore, the data filtering comprises, in a preferred embodiment, applying a Magnitude Filtering, FM, filter type to ignore or eliminate the low amplitude frequencies or harmonics related to the noise in the voltage signal and also comprises a frequency filtering, which can be a Finite Impulse Response, FIR, filter type similar to the FIR of step 706. In summary, this filtering is applied to the voltage samples to eliminate very small voltage changes, very high frequencies and/or noise with frequencies greater than 5 kHz to let only the desired or objective signal pass.

Because each type of lighting device technology consumes current at different frequencies, which range from 10 Hz for LED-type lighting devices to 4.7 kHz for CFL-type lighting devices, it is necessary to perform a frequency analysis. In addition to the frequency analysis, it has to be mentioned that for determining the type of technology, the duty cycle of the current consumption of the lighting device is necessary, since each type of technology can vary its current consumption in different duty cycles. As an example, in some lighting device technologies, the cycle of the current consumption wave may be less than one cycle of the AC power supply wave, or in other cases there may be between an approximate range of 5 to 10 cycles of the wave compared to the AC power supply, or duty cycles may vary depending on the lighting device according to the manufacturer.

Therefore, in step 711, the microprocessor of the smart switch device 100 performs a digital processing method to obtain the current consumption behavior in the frequency of the lighting device 107, wherein the filtered voltage signal is applied digital processing, that is, in a preferred embodiment, a Discrete Fourier Transform, DFT, is performed in which the samples of voltage signals that are taken in the time domain are transformed or converted into the frequency domain. Therefore, a frequency (Hz) and amplitude in decibels (dBm) ratio of the voltage signal samples is obtained.

In a parallel step 712 that is performed in a very small period of time imperceptible to the user, the microprocessor also executes a process to calculate only the current consumption of the source of the smart switch device 100 with the lighting devices turned OFF, process in which the current consumption data of the source of the smart switch device 100 is obtained by performing steps 705, 706 and 711. These data of the current consumption of the source are also transformed into frequency to discard said information in the frequency analysis 713.

Subsequently, with the parameters of frequency (Hz) and amplitude in decibels (dBm) obtained in steps 711 and 712, the predominant frequencies of the current consumption of the lighting device 107 are analyzed. That is, the less relevant frequencies are filtered (such as, 6 dBm) with respect to the maximum frequency and the frequencies of the smart switch 100 source are differentiated to have only the frequencies of the lighting device 107.

Once the predominant frequencies have been analyzed, the type of technology of the lighting device 107 that is connected to the smart switch device 100 is determined in step 714, which is carried out when comparing the frequency results and the periodic pattern of the current signal (duty cycle) with the different types of lighting devices 107 existing.

In the comparison, step 714, which is performed in the central control system 200, the results obtained from the frequency current signal are compared with a frequency data model stored in the memory of the central control system 200 database. The database contains precisely the model with frequency data measured and analyzed from an experimental calibration previously made of the different types of lighting device technologies, tested in factory conditions where the data is conditioned and stored in the database of the central control system 200 to be read. In comparison 714, the phase shift (duty cycle) pattern of the current consumption frequencies of the lighting device 107 is also compared to the frequency of the AC power source, thereby determining what type of lighting device 107 is connected. By way of example, in a condition 500 wherein if the current consumption frequency of the lighting device 107 is greater than 400 Hz it is determined that it is a Compact Fluorescent Light, CFL, type technology lighting device 502. In another condition 501, by way of example, wherein if the current consumption frequency of the lighting device 107 is less than 50 Hz it is determined that it is a Light-Emitting Diode, LED, technology type lighting device 503 or in the case that the frequency of the current consumption of the lighting device 107 does not meet any of the conditions 500 and 501 that means that the frequency is equal to that of the AC source and, therefore, it is determined that it is an incandescent type technology or resistive lighting device 504, this result 505 is further verified with the stored frequency model of the database. Subsequently, this verified information is stored in the database 205 of the central control system 200 for its registration or subsequent calculations.

An important fact is to know the real power 715 consumed by the lighting device 107 for the smart switch device 100, the central control system 200 and an end user. For this, the method allows estimating the effective power 715 of the lighting device 107 from the results obtained by the functions of: determination of current consumption 710 and determination of technology type 505 of the lighting device 107. First, in database 205, information on power percentages and quality factors is stored according to the type of lighting device technology, said information, in a preferred embodiment, is conditioned by using Taylor polynomials, wherein information is evaluated to determine what amount of active and reactive power is consumed depending on the type of lighting device 107.

The central control system 200 performs an evaluation with the information stored in the database 205, that is, with the percentages of power and quality factors for the different types of technology, together with the result of the current consumption 710 and the identification of technology type 505 of the lighting device 107 connected, the percentage of active power and the percentage of reactive or imaginary power are calculated to obtain the actual power 715 of the lighting device 107. This information is stored in the database 205 of the central module 200 for a record or subsequent calculations required by the central control system 200.

The lighting devices 107 over time, with frequent use, have a different operation than the factory one due to the deterioration of their components or materials. The deterioration of the lighting devices 107 is mainly observed in the current consumption or changes in the frequency, that is, a less uniform behavior in the current consumption frequency. For this, it is necessary to detect irregular behaviors in the operation of a lighting device 107, in order to avoid high energy consumption or providing an alert to change the lighting devices before a failure occurs.

Figure 6:
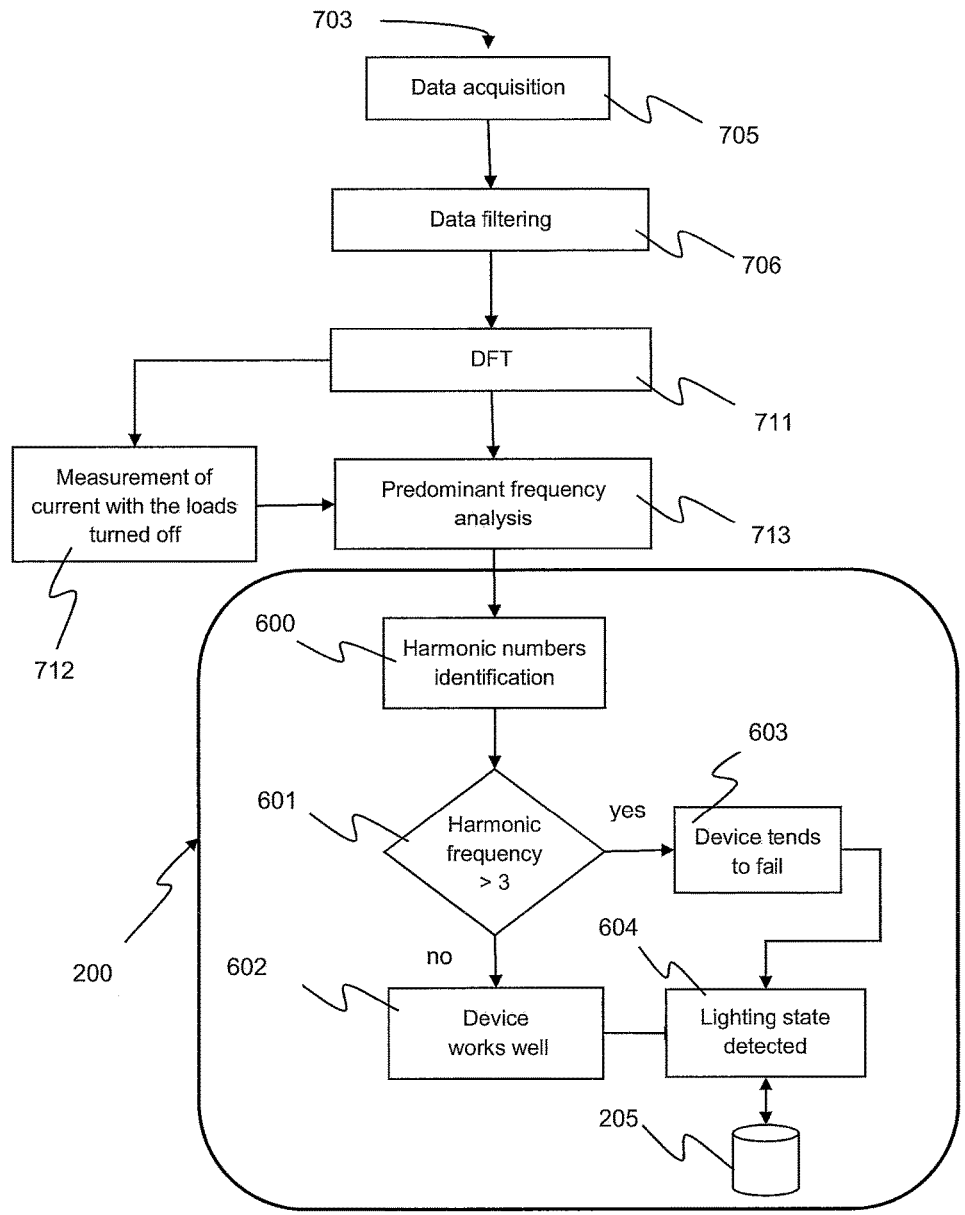
FIG. 6 is a flowchart of the steps performed by the function detecting irregular behavior in the operation of a lighting device.

FIG. 6 depicts a flowchart of a function 703 for detecting irregular behavior in the operation of a lighting device 107 connected to the smart switch device 100. This function 703 is performed by the microcontroller of the smart switch device 100 and the function 703 which is performed each time the central control system 200 requests it.

The function 703 performs the same steps 705, 706, 711, 712, 713 as the function 702 to obtain the frequency data that represents the consumed current of the lighting device 107. Wherein function 703 execute a harmonic frequency analysis 600, performed within the central control system 200, a calculation is executed to detect a certain amount of maximum numbers of relevant harmonic frequencies 600 of current consumption of the lighting device 107, wherein, in a condition 601 for a first case if the maximum number of detected harmonics is greater than 3 it is determined that the lighting device 107 is likely to tend to fail 603 within a close period of time, which includes to determine if there is an increase in the current consumption of the lighting device 107 by means the comparing to what was initially recorded, so that, the existence of instability in the source of the smart switch device 100 can also be detected. Otherwise in a second case that in condition 601 the number is not greater than 3, it is reported that the lighting device 107 continues operating correctly 604. In any of cases the resulting is stored in the database 205 of the central control system 200 for recording or subsequent calculations.

Figure 7:
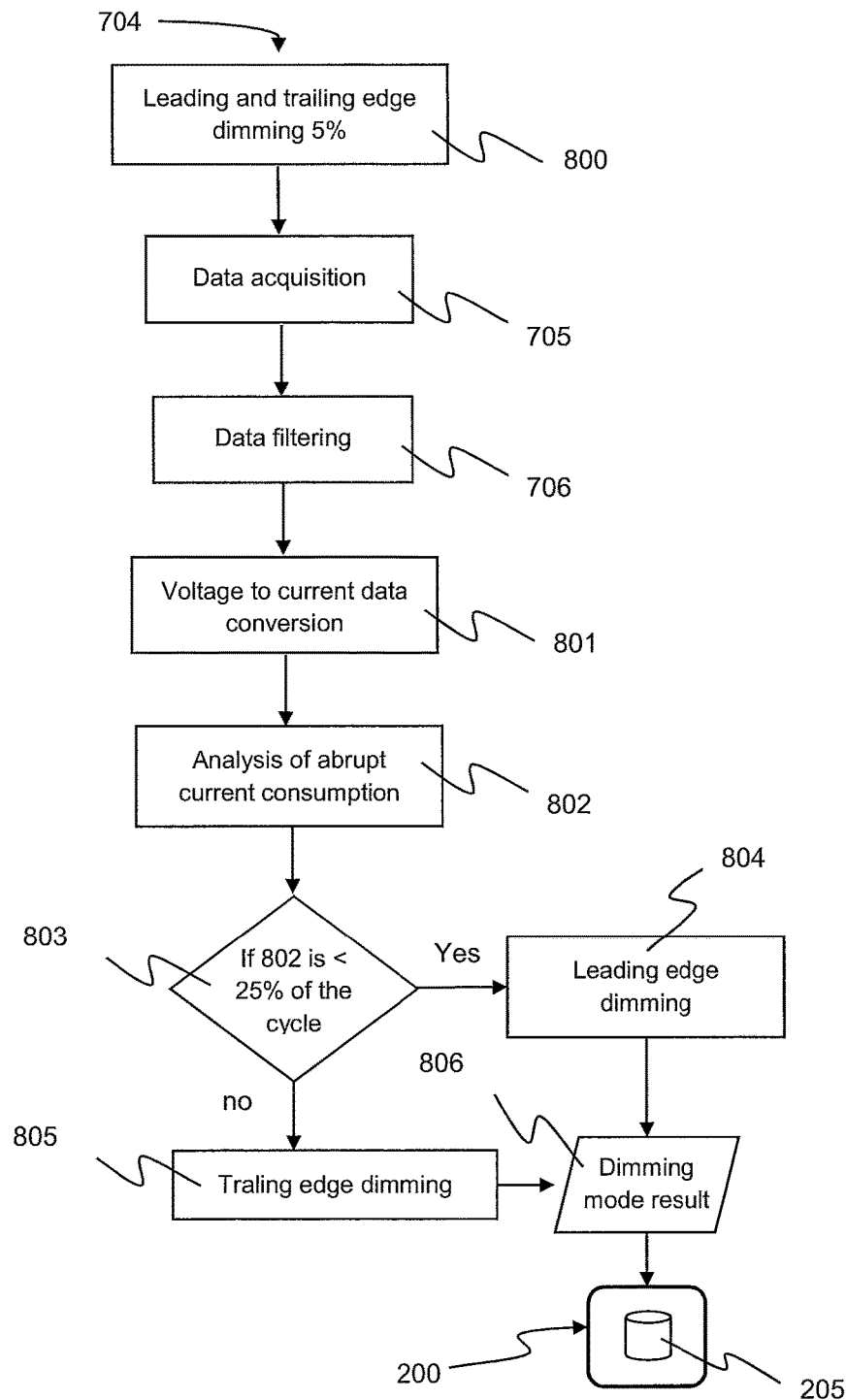
FIG. 7 is a flowchart of the steps performed by the dimming mode detection and selection function according to the type of lighting device.

FIG. 7 depicts a flowchart of a function for determining and selecting the most appropriate dimming mode, depending on the type of technology of the lighting device 107 connected to the smart switch device 100. This function is implemented since there is a large variety of lighting technologies, which respond to a specific dimming mode, depending on the configuration of the internal electronics used by the manufacturer of the lighting device. The above mentioned is due to the fact that, by inappropriately dimming of a lighting device, they can may exhibit different abnormal behaviors, such as flickering thereof, increase in the consumption of electrical power and/or reduction of the life period of the lighting device.

Figure 8:
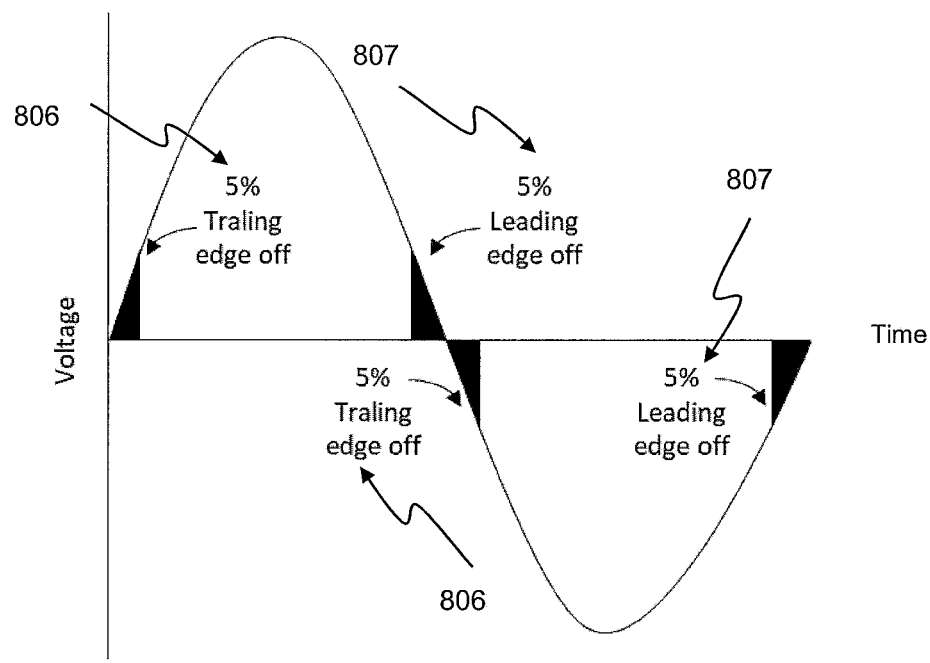
FIG. 8 is a figure showing the dimming mode used in the method applied in an AC wave cycle.

The function 704 to determining and selecting the dimming mode is executed by a microcontroller of the smart switch 100 and is performed whenever the central module 200 requests it. The function 704 starts at a step 800, where the lighting device 107 is dimming, that in a preferred embodiment, the lighting device is turned off at 5% of the wave cycle at the start 806 and at the end of the wave 807 both in the positive and the negative curve of the AC power wave, for example, as shown in FIG. 8. This dimming mode, commonly is called trailing 806 and leading 807 edge, that is applied in the same sine wave, that is, they are simultaneously applied in the same wave cycle.

After execute step 800, to observe the current behavior of the lighting device, an analysis of the obtained signal is carried out. Therefore, steps 705 and 706 are performed as above mentioned in the previous functions, that is, a data acquisition of the current consumption that is obtained during a set period of time similar to that of function 701, then the same step 706 is performed, which performs a filtering of data corresponding to a n number of samples of values of the voltage signal obtained. In step 801 the filtered voltage samples are converted to current consumption samples of the lighting device 107. In a subsequent step 802, the current consumption samples are analyzed to identify and determine the most abrupt current consumption 808 in the AC wave cycle caused by the 5% trailing and leading edge dimming performed in step 800. In this same step, in addition to determining the most abrupt current consumption 808, the location of the maximum current consumption within the AC wave cycle is also determined.

Figure 9:
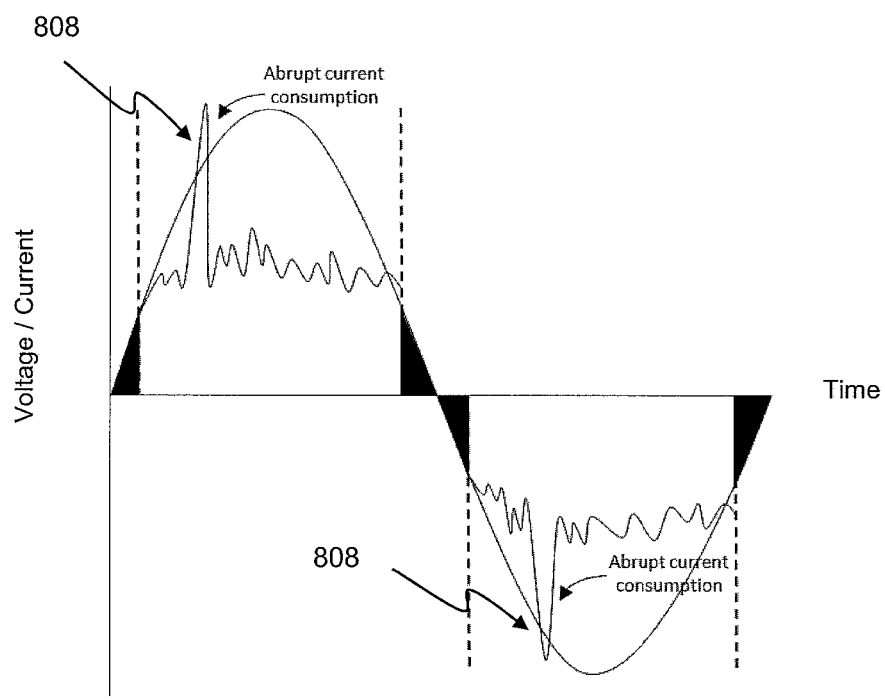
FIG. 9 is a figure showing the abrupt consumption of current as a response of the lighting device to the dimming mode used by the method applied in an AC wave cycle.

In step 803, the dimming mode is selected in a selection condition depending on the result obtained in step 802. By way of example, in a preferred embodiment, in a first case, if the most abrupt current consumption 808 is located before a 25% of the AC wave cycle, for example, as shown in FIG. 9, the most suitable dimming mode for not damaging the lighting device 107 is selected as a leading edge type dimming mode 804. This abrupt current consumption 808 occurs due to the trailing edge dimming mode that was applied in step 800, said abrupt current consumption 808 is due to the lighting device 107 not responding or operating properly with the dimming mode applied at 5% (trailing edge), due to the configuration of the internal electronics of the lighting device 107 that was designed by the manufacturer and which responds to a specific dimming mode. Therefore, a suitable manner to dimming the lighting device is in leading edge mode.

In another example, in a second case, with the condition of step 803, if the most abrupt current consumption is located after 25% of the wave cycle of the AC wave, in a preferred embodiment, the appropriate dimming mode corresponds to a trailing edge mode, since the abrupt current consumption is caused by the leading edge dimming mode, said maximum current consumption is due to the lighting device 107 not responding or operating properly with the dimming mode applied 800, due to the configuration of the internal electronics of the lighting device 107 that was designed by the manufacturer and which responds to a specific dimming mode.

Once the appropriate dimming mode 804 or 805 has been determined and selected for the lighting device 107, said result is stored and sent to the database 205 of the central control system 200, so that the selected dimming mode is specifically set for the lighting device or until the lighting device 107 is replaced or the central control system 200 again requests performing the function to determine or select the dimming mode, or when a user need to request said function.

Figure 10:
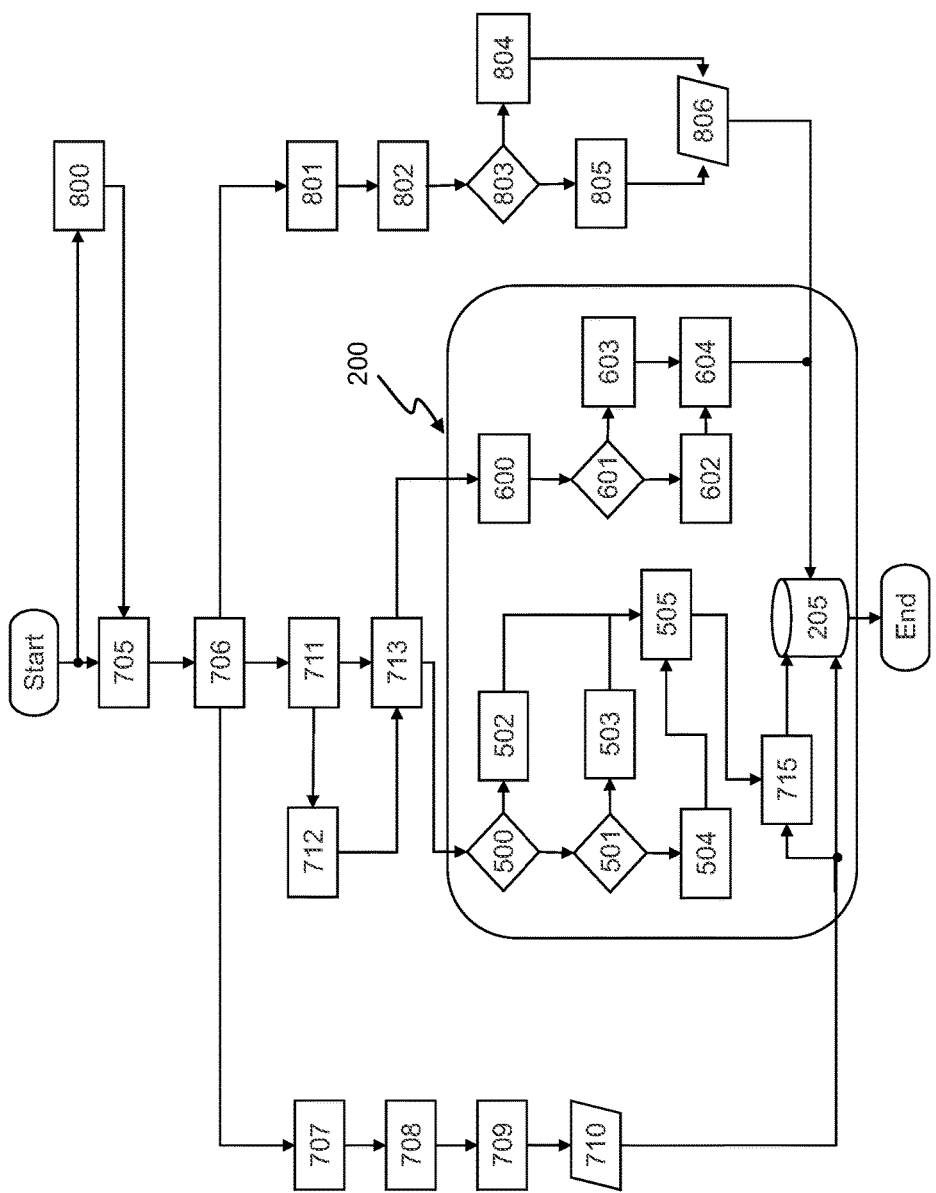
FIG. 10 is a flow chart of the functions integrating the method as a whole.

FIG. 10 shows the method for analyzing operating parameters for lighting technologies of a smart switch device. As can be seen in the description in each of the functions, there are common steps that are performed once for the different functions using them in the method, as can be seen in FIG. 10, where the first step 705 in common is the acquisition of data through sampling which then passes through a filtering in step 706, wherein at the end of function 701 and 702 the result of the current consumption of step 710 and the type of technology detected from step 505 are used to obtain the power consumption in step 715 which is performed by the central module 200 and are sent to database 205 thereof. Functions 702 and 703 of the method share steps 711, 712 and 713 which are executed to perform functions 702 and 703 which performs the technology type determination and the determination irregular behavior whose results are sent to the database 205 of the central module 200 as described above. Function 704 likewise uses the data acquisition of step 705 and data filtering of step 706, wherein the result obtained by the function is the dimming mode corresponding to the connected lighting technology and wherein said result is also sent to the database 205 of the central module 200.

Other embodiments of the invention will be apparent to those skilled in the art from consideration of the specification and practice of the invention disclosed here.

This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

The invention claimed is:

1. A method to analyze operating parameters in a smart switch, the method includes:
    sampling a voltage of a current consumption of at least one lighting device acquired by means a sensing module of the smart switch, wherein an ADC module of the smart switch converts the samples of the voltage of the current consumption to digital voltage samples;
    filtering the digital voltage samples by data filtering, said data filtering comprising:
        a Noise Reduction Filter, NRF, filter type
        a Magnitude Filtering, FM, filter type
        a Finite Impulse Response, FIR, filter type
    determining the current consumption of the at least one lighting device, through an application of a polynomial interpolation to attenuate the digital voltage samples and in this way calculate a Root Mean Square, RMS, of the digital voltage sample;
        wherein determining the current consumption of the at least one lighting device further comprises estimate a correct current consumption with a database of a central control system, and comparing a RMS data of the digital voltage sample against a plurality of operating variables to determine the current consumed, the comparison data is sent to the database of the central control system;
    determining a type of technology of the at least one lighting device using the digital voltage samples, wherein the filtered digital voltage samples are transformed from a time domain to the frequency domain;

wherein determining the type of technology of the at least one lighting device further comprises performing a predominant frequency analysis on the transformed digital voltage samples, to identify a predominant frequency;

wherein the type of lighting technology of the lighting device is determined according to a comparison between the predominant frequency and a preset threshold frequency;

further wherein the type of lighting technology determined is sent to a database record of a central control system;

detecting an irregular behavior in the operation of the at least one lighting device, which comprises identifying harmonics by using the predominant frequency analysis;

wherein the irregular behavior in the operation of the at least one lighting device is determined according to a comparison between a number of identified harmonics and a harmonics threshold;

further wherein the identified irregular behavior is sent to a database record of a central control system;

determining and selecting a most appropriate dimming mode for the at least one lighting device, wherein the at least one lighting device is dimmed by a leading and trailing edge hybrid method during a preset percentage of AC wave cycle;

wherein determining and selecting the most appropriate dimming mode, after sampling, filtering and converting the digital voltage of the current consumption of the at least one lighting device, further comprises an abrupt current consumption analysis of the lighting device;

wherein determining and selecting the most appropriate dimming mode of the at least one lighting device further comprises determining a dimming mode by making an identification of an abrupt current consumption percentage location within a wave cycle and selecting the dimming mode according to the abrupt consumption location within the cycle;

further wherein determining and selecting the most appropriate dimming mode of the at least one selected lighting device is sent to the database record of the central control system.

2. The method according to claim 1, wherein the operating variables comprise at least one of time, AC voltage, or source voltage of the smart switch device.

3. The method according to claim 1, wherein the transformation of the time domain to the frequency domain is performed by a Discrete Fourier Transform, DFT.

4. The method according to claim 1, wherein identifying the predominant current consumption frequency of the lighting device comprises:
   filtering less relevant frequencies with respect to the maximum frequencies and differentiate the frequencies of the smart switch source to discard the less relevant frequencies and store the frequencies of the lighting device; and
   comparing the filtered frequencies and a periodic and/or phase shift pattern of the current consumption frequency with a frequency data model of the central control system database of the existing lighting devices.

5. The method according to claim 1, wherein determining the type of lighting device technology comprises:
   selecting, if the predominant frequency is greater than a threshold frequency, the lighting device corresponds to a lighting device of the CFL type;
   selecting if the predominant frequency is lower than a threshold frequency, the lighting device corresponds to a lighting device of the LED type;
   selecting, if the predominant frequency is equal to the frequency of the AC line, the lighting device corresponds to an incandescent lighting device.

6. The method according to claim 1, wherein detecting the irregular behavior in the operation of the at least one lighting device comprises:
   if the number of detected harmonics is greater than a harmonics threshold, the lighting device is likely to tend to fail within a short period of time;
   if the number of detected harmonics is lower than a harmonics threshold, the lighting device is operating correctly.

7. The method according to claim 1, further comprising estimating the effective power of the at least one lighting device is performed with a result obtained of the determination of the current consumption and the determination of the type of technology of the at least one lighting device.

8. The method according to claim 1, wherein the smart switch is an ON/OFF type switch.

9. The method according to claim 1, wherein the smart switch is a dimming type switch.

* * * * *